US007654362B2

(12) United States Patent
Suzuki et al.

(10) Patent No.: US 7,654,362 B2
(45) Date of Patent: Feb. 2, 2010

(54) SPEAKER AND METHOD OF OUTPUTTING ACOUSTIC SOUND

(75) Inventors: Nobukazu Suzuki, Kanagawa (JP); Masaru Uryu, Chiba (JP); Yoshio Ohashi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/699,438

(22) Filed: Jan. 30, 2007

(65) Prior Publication Data

US 2007/0186749 A1 Aug. 16, 2007

(30) Foreign Application Priority Data

Feb. 2, 2006 (JP) ............................ 2006-026164

(51) Int. Cl.

| | |
|---|---|
| ***G10K 11/02*** | (2006.01) |
| ***G10K 11/22*** | (2006.01) |
| *H05K 5/02* | (2006.01) |
| *G10K 11/18* | (2006.01) |
| *H04R 1/20* | (2006.01) |

(52) U.S. Cl. ...................... 181/153; 181/156; 181/196; 381/338

(58) Field of Classification Search ................ 181/153, 181/152, 156, 196, 195; 381/338, 349
See application file for complete search history.

(56) References Cited

U.S. PATENT DOCUMENTS

| | | | | |
|---|---|---|---|---|
| 1,692,994 | A * | 11/1928 | Mattis | 181/195 |
| 1,803,892 | A * | 5/1931 | Corrigan | 181/163 |
| 2,878,887 | A * | 3/1959 | Potter | 181/151 |
| 2,905,259 | A * | 9/1959 | Ashe | 181/159 |
| 3,393,766 | A * | 7/1968 | Mitchell | 381/300 |
| 3,750,838 | A * | 8/1973 | Pyle, Jr. | 181/153 |
| 3,945,461 | A * | 3/1976 | Robinson | 181/153 |
| 3,978,941 | A * | 9/1976 | Siebert | 181/151 |
| 4,580,654 | A * | 4/1986 | Hale | 181/146 |
| 4,592,444 | A * | 6/1986 | Perrigo | 181/151 |
| 5,105,905 | A * | 4/1992 | Rice | 181/155 |
| 5,111,509 | A * | 5/1992 | Takeuchi et al. | 381/338 |
| 5,734,728 | A * | 3/1998 | Meissner | 381/89 |
| 5,886,304 | A * | 3/1999 | Schlenzig et al. | 181/155 |
| 6,055,320 | A * | 4/2000 | Wiener et al. | 381/343 |
| 6,078,676 | A * | 6/2000 | Takenaka | 381/338 |
| 6,859,543 | B2 * | 2/2005 | Fingleton | 381/338 |
| 6,973,994 | B2 * | 12/2005 | Mackin et al. | 181/156 |

FOREIGN PATENT DOCUMENTS

| | | |
|---|---|---|
| JP | 2001-224089 | 8/2001 |

* cited by examiner

*Primary Examiner*—Edgardo San Martin
(74) *Attorney, Agent, or Firm*—Finnegan, Henderson, Farabow, Garrett & Dunner, L.L.P.

(57) ABSTRACT

A speaker has a pipe member with opposed open ends, and a sounding body that is attached to any one of the opposed open ends of the pipe member on the same axle as that of the pipe member. The sounding body is driven on the basis of an acoustic signal that is applied to the sounding body. Sound wave radiated from the sounding body and passed through an inside of the pipe member vibrates with a pipe wall of the pipe member, thereby to enable sound wave corresponding to the acoustic signal to radiate from a whole of an outside surface of the pipe member to outside.

8 Claims, 6 Drawing Sheets

SPEAKER AND METHOD OF OUTPUTTING ACOUSTIC SOUND

CROSSREFERENCE TO RELATED APPLICATION

The present invention contains subject matters related to Japanese Patent Application JP 2006-026164 filed in the Japanese Patent Office on Feb. 2, 2006, the entire contents of which being incorporated herein by reference.

BACKGROUND OF THE INVENTION

1. Field of the Invention

The present invention relates to a speaker and a method of outputting acoustic sound.

2. Description of Related Art

Japanese Patent Application Publication No. 2001-224089 has disclosed an omni-directional speaker in which a speaker unit is attached to an end of a pipe member having opposed open ends on the same axle as that of the pipe member. In such the speaker, the pipe member acts as a resonator to enhance its low frequency components.

SUMMARY OF THE INVENTION

In the above speaker which has been disclosed by the Japanese Patent Application Publication No. 2001-224089, any sound wave radiated from the speaker unit radiates from only any or both ends of the pipe member to outside. Accordingly, it causes an acoustic image to be localized to solely the ends of the pipe member. Thus, in such the speaker, it is difficult to avoid localizing the acoustic image and accomplish a wide dispersion of sound to the whole of the pipe member to spread its acoustic image to the whole of the pipe member so that a listener can get a global acoustic image on the speaker.

It is desirable to provide a speaker and a method of outputting acoustic sound that accomplish a wide dispersion of sound to the whole of the pipe member to spread its acoustic image to the whole of the pipe member, thereby getting a listener a global acoustic image on the speaker.

According to an embodiment of the present invention, there is provided a speaker containing a pipe member having opposed open ends, and a sounding body that is attached to any one of the opposed open ends of the pipe member on the same axle as that of the pipe member. The sounding body is driven on the basis of an acoustic signal that is applied to the sounding body. Sound wave radiated from the sounding body and passed through an inside of the pipe member vibrates with a pipe wall of the pipe member. Thus, by the pipe wall, sound wave corresponding to the acoustic signal radiates from a whole of an outside surface of the pipe member to outside.

According to this embodiment, the speaker contains the pipe member and the sounding body. The pipe member has the opposed open ends. The sounding body is driven on the basis of the acoustic signal. The sounding body is attached to any one of the opposed open ends of the pipe member on the same axle as that of the pipe member so that sound wave radiated from the sounding body can be passed through the inside of the pipe member and be radiated from the other end of the pipe member. This allows the pipe member to act as a resonator to enhance its low frequency components.

The sound wave passed through the inside of the pipe member vibrates with the pipe wall of the pipe member. The pipe wall of the pipe member is made light and thin so that the sound wave (compressions and rarefactions in air particles) can vibrate with it. Such vibration by the sound wave enables sound wave corresponding to the acoustic signal to radiate from the whole of the outside surface of the pipe member to outside. This allows a listener to feel any even sound pressure from each position of the pipe member along a longitudinal direction thereof, thereby spreading its acoustic image to the whole of the pipe member to get the listener a global acoustic image on the speaker.

For example, the pipe member is configured so that it can have different diameters of its circular cross sections, which can be gradually made larger toward a propagation direction of the sound wave from the sounding body. This causes electric inductance component to be increased to get a flat frequency property and a resonance dumping effect. This also enables an output of the pipe member, from which the sound wave radiates, to be enlarged as compared with a pipe member having no gradually enlarged diameters of its circular cross sections, thereby enhancing the spread of acoustic image.

According to another embodiment of the present invention, there is provided a method of outputting an acoustic sound by radiating sound wave radiated from an sounding body that is driven on the basis of an acoustic signal, which is applied the sounding body, to outside using a pipe member having opposed open ends. The method has a step of attaching the sounding body to any one of the opposed open ends of the pipe member on the same axle as that of the pipe member to pass the sound wave radiated from the sounding body through the inside of the pipe member. The method also has a step of vibrating with a pipe wall of the pipe member by the sound wave passed through the inside of the pipe member to enable sound wave corresponding to the acoustic signal to radiate from a whole of an outside surface of the pipe member to outside.

According to this embodiment of the invention, the sound wave radiated from an sounding body driven on the basis of an acoustic signal that is applied the sounding body and passed through the inside of the pipe member vibrates with the pipe wall of the pipe member so that sound wave corresponding to the acoustic signal can radiate from a whole of an outside surface of the pipe member to outside. This also allows a listener to feel any even sound pressure from each position of the pipe member along a longitudinal direction thereof, thereby spreading its acoustic image to the whole of the pipe member to get the listener a global acoustic image on the speaker.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENTS

The following will describe embodiments of the present invention with reference to the accompanied drawings.

Figure 1:
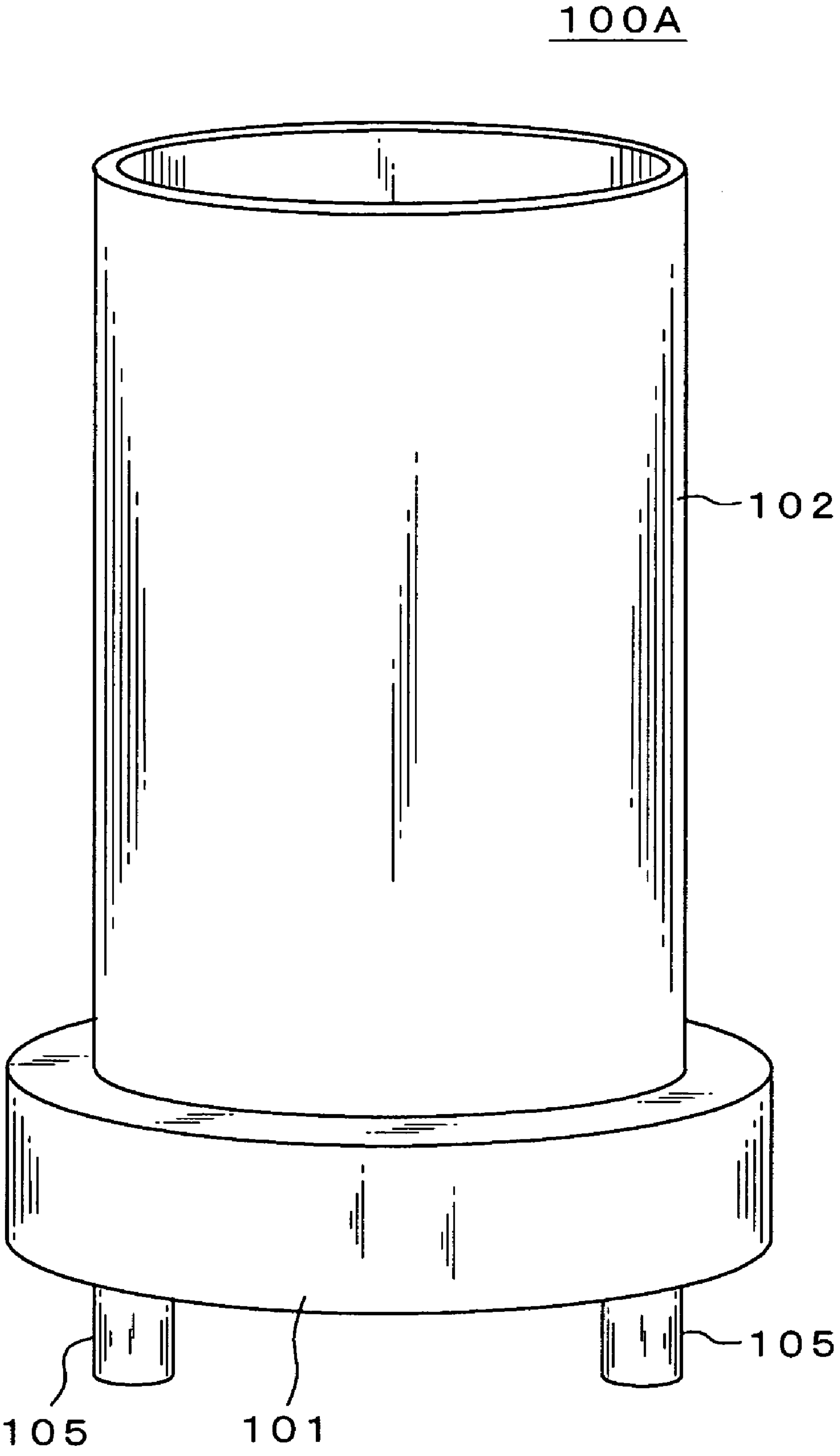
FIG. 1 is a perspective view of a speaker 100A according to an embodiment of the invention.
Figure 2:
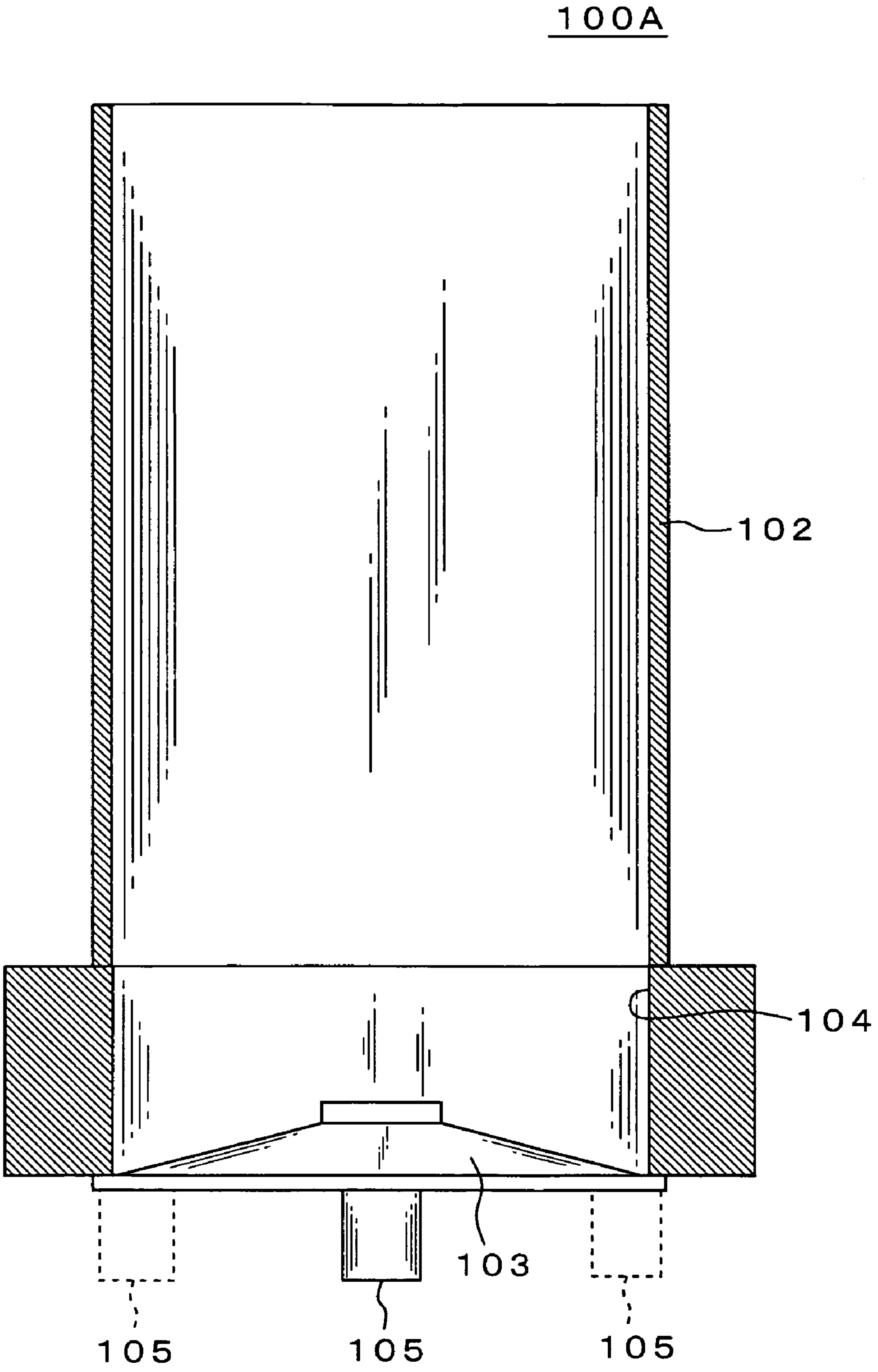
FIG. 2 is a vertical sectional view of the speaker 100A according to the embodiment of the invention.
Figure 3:
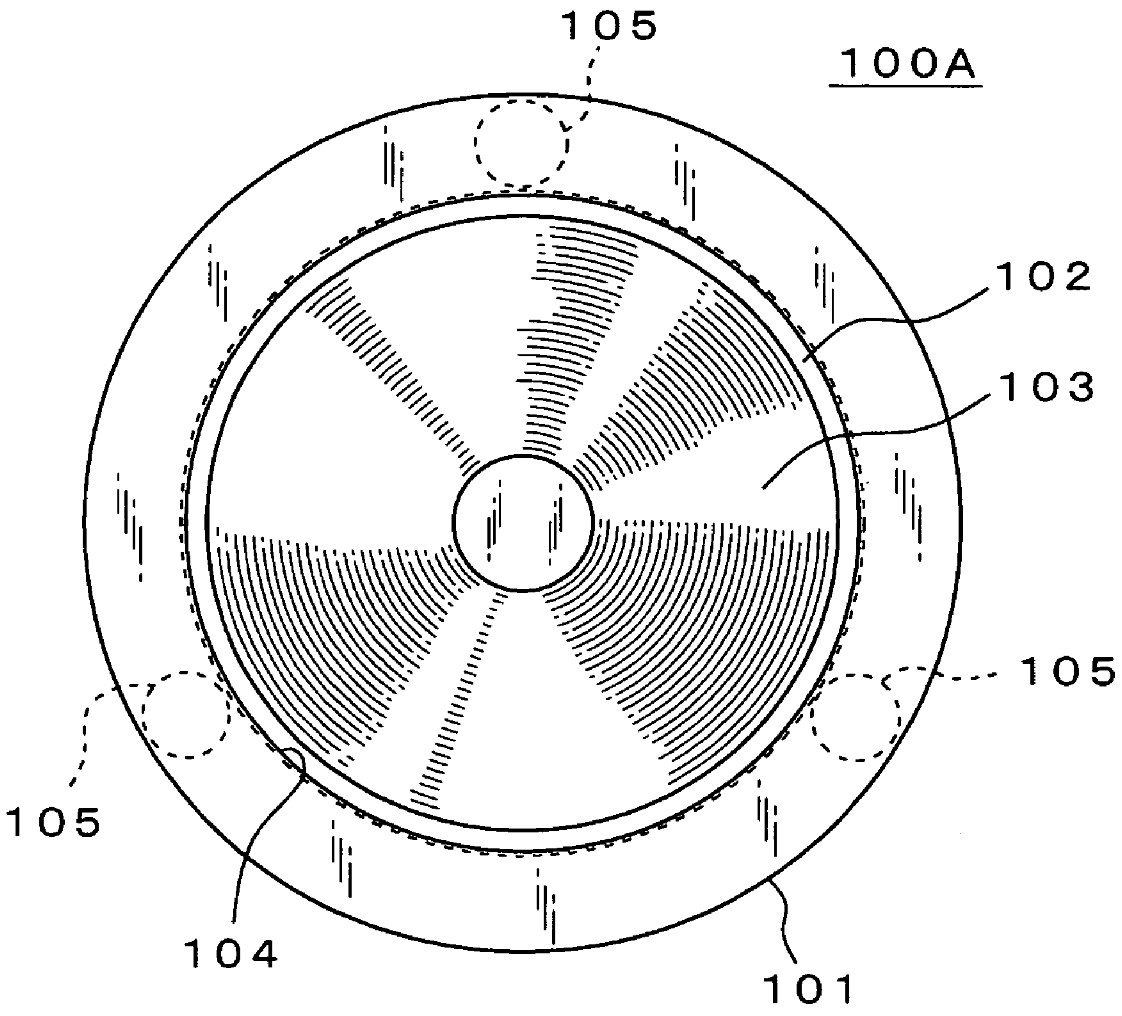
FIG. 3 is a top plan view of the speaker 100A according to the embodiment of the invention.
Figure 4:
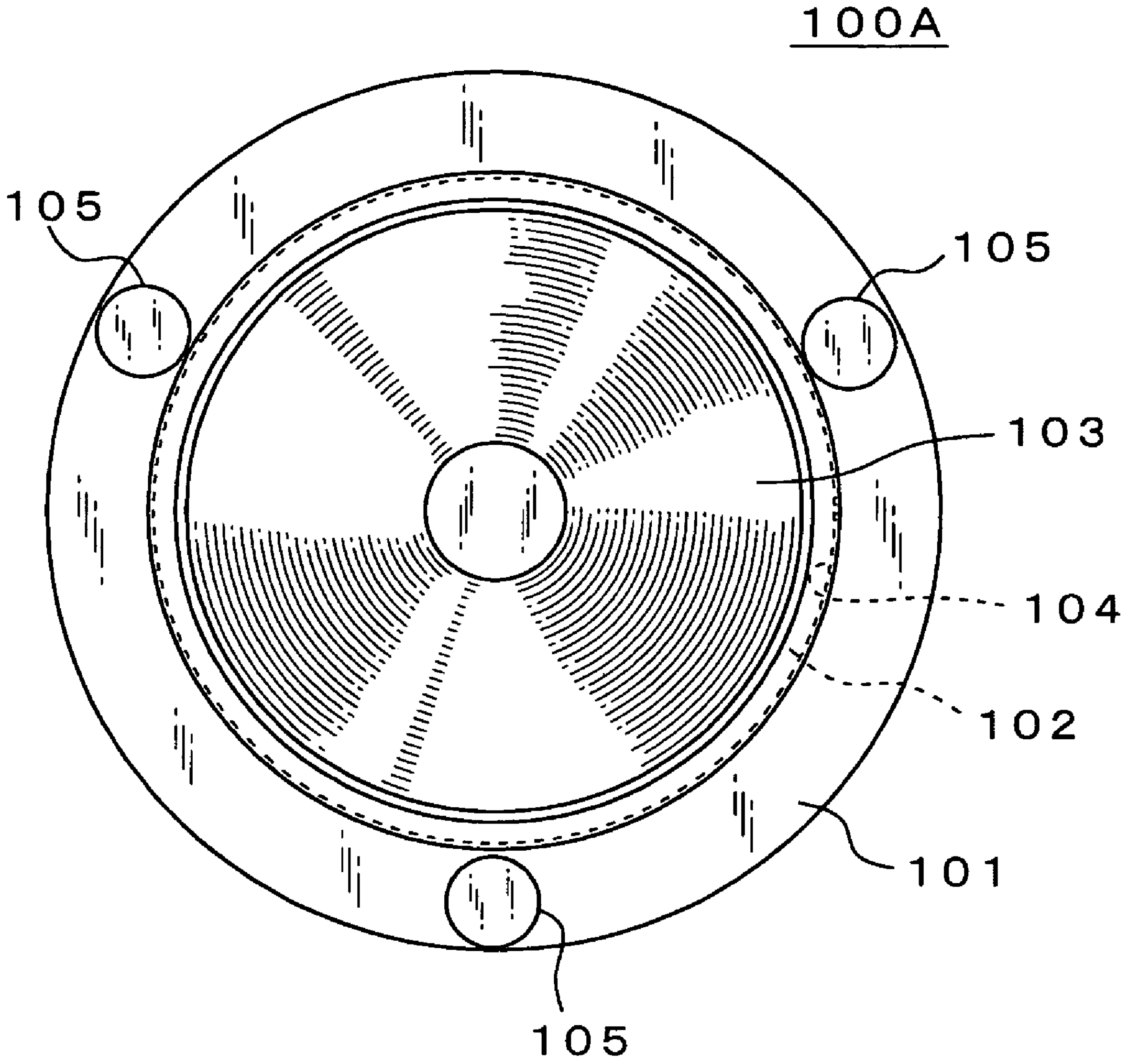
FIG. 4 is a bottom plan view of the speaker 100A according to the embodiment of the invention.

FIGS. 1 through 4 show a configuration of a speaker 100A according to an embodiment of the invention. FIG. 1 is a perspective view of the speaker 100A according to the embodiment of the invention; FIG. 2 is a vertical sectional view thereof; FIG. 3 is a top plan view thereof; and FIG. 4 is a bottom plan view thereof.

The speaker 100A has a base casing 101, a pipe member 102, and a speaker unit 103 using an electrodynamic actuator as a sounding body.

The base casing 101 is made of, for example, synthetic resin. This base casing 101 has a shape like a disk as a whole and a cylindrical opening 104 passing through it at a center portion thereof. This base casing 101 also has a predetermined number of legs 105, in this embodiment, three legs, at the same distance along a lower outer circumference portion thereof.

If the base casing 101 has three legs 105, it is possible to implement a more stable setting thereof than a case where the base casing 101 has four legs because these three legs 105 may be necessarily contacted to any places to be contacted. Further, providing a bottom surface of the base casing 101 with the legs 105 enables the bottom surface thereof to be away from the places to be contacted. This allows sound wave radiated from the speaker unit 103 that is provided on and under the base casing 101 to radiate through the bottom surface of the base casing 101 toward outside.

The pipe member 102 is made light and thin so that sound wave radiated from the speaker unit 103 can vibrate with its pipe wall. For example, the pipe member 102 is made of polycarbonate resin and has a thickness of 0.5 mm. The pipe member 102 has the opposed open ends. A lower end of the pipe member 102, one end thereof, is fixed on a top surface of the base casing 101 using, for example, adhesive.

The pipe member 102 is configured to have a diameter almost identical to that of the cylindrical opening 104 formed in the base casing 101 and to be aligned with the cylindrical opening 104, in order to act as the resonator.

The speaker unit 103 is installed on the base casing 101 by using screws, not shown, with its front side being put upside down and its main body being received in the cylindrical opening 104 at a lower end of the base casing 101. The speaker unit 103 is arranged so that it can be put on the same axis as that of the pipe member 102. The speaker unit 103 is driven on the basis of an acoustic signal obtained by, for example, a CD player, a DVD player and the like.

Sound wave of positive phase radiated from a front side of the speaker unit 103 radiates to outside by passing through the bottom surface of the base casing 101. Sound wave of negative phase radiated from a back side of the speaker unit 103 radiates from an upper end of the pipe member 102 to outside by passing through the cylindrical opening 104 and the pipe member 102.

The following will describe operations of the speaker 100A shown in FIGS. 1 through 4.

The speaker unit 103 installed on the lower end of the base casing 101 is driven on the basis of the acoustic signal obtained by a CD player, a DVD player and the like, as described above. Sound wave of positive phase radiates from the front side of the speaker unit 103. Sound wave of negative phase radiates from the back side of the speaker unit 103.

Figure 5:
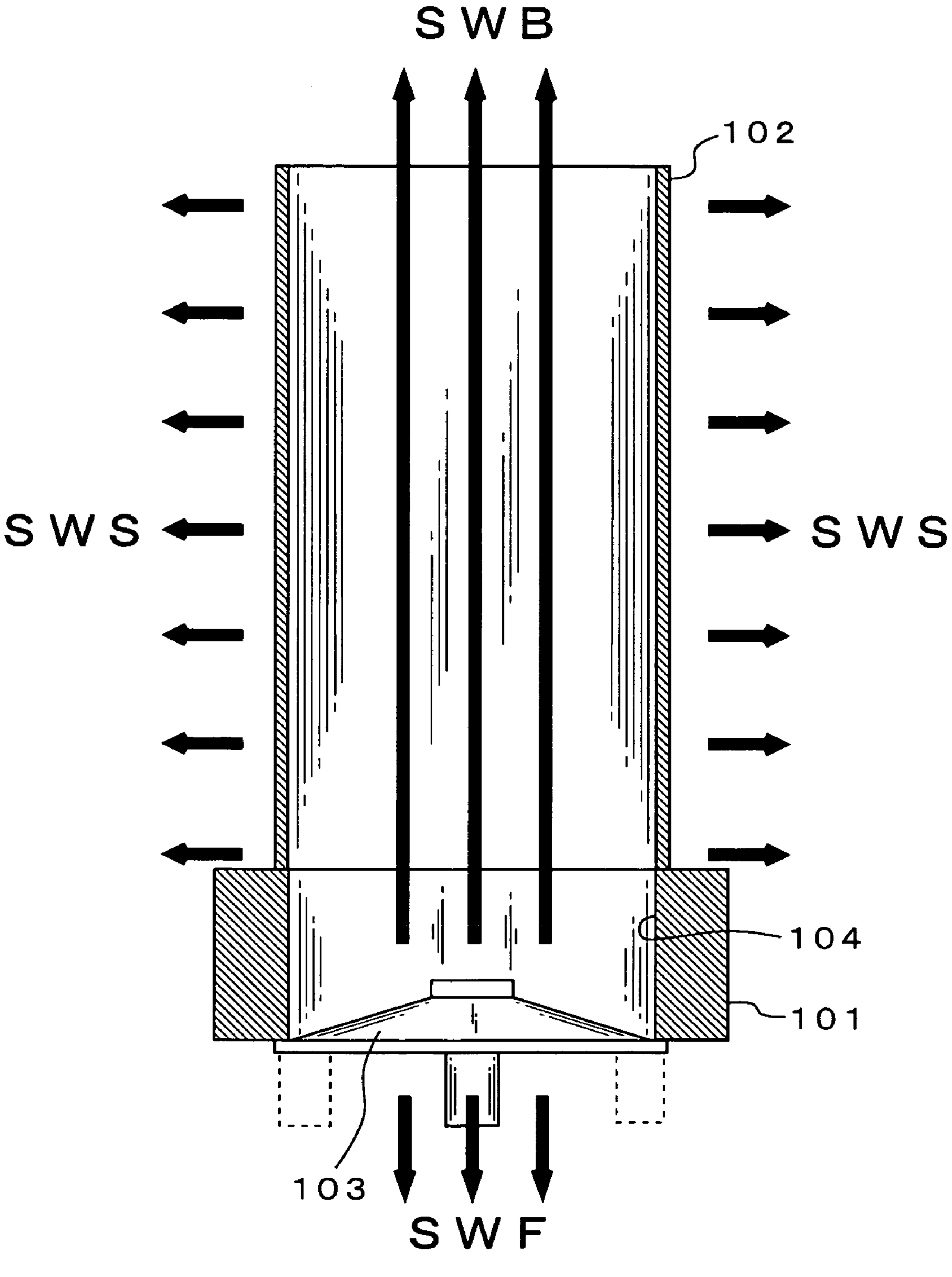
FIG. 5 is a sectional view of the speaker 100A for explaining radiation of sound wave from a whole of the pipe member.

The sound wave SWF radiated from the front side of the speaker unit 103 radiates to outside by passing through the bottom surface of the base casing 101, as shown in FIG. 5. The sound wave SWB radiated from the back side of the speaker unit 103 radiates from the upper end of the pipe member 102 to outside by passing through the cylindrical opening 104 and an inside of the pipe member 102, as shown in FIG. 5. In this moment, the pipe member 102 acts as a resonator to enhance its low frequency components.

The sound wave SWB (compressions and rarefactions in air particles) passing through the inside of the pipe member 102 vibrates with the pipe wall of the pipe member 102 because the pipe member 102 is made light and thin so that the sound wave can vibrate with its pipe wall, as described above. Such the vibration by the sound wave enables the pipe wall of the pipe member 102 to vibrate corresponding to this sound wave SWB so that sound wave SWS, as shown in FIG. 5, corresponding to the acoustic signal that drives the above speaker unit 103 can radiate from the whole of the outside surface of the pipe member 102 to outside.

According to the speaker 100A as shown in FIGS. 1 through 4, the sound wave radiated from the speaker unit 103 that is driven on the basis of the acoustic signal vibrates with the pipe wall of the pipe member 102 and then, the sound wave SWS corresponding to the acoustic signal that drives the above speaker unit 103 can radiate from the whole of the outside surface of the pipe member 102 to outside. This allows the listener to feel any even sound pressure from each position of the pipe member 102 along a longitudinal direction thereof, thereby spreading its acoustic image to the whole of the pipe member 102 to get the listener a global acoustic image on the speaker.

Further, the pipe member 102 opens at the other end thereof in addition of the open end on which the speaker unit 103 is installed so that the pipe member 102 can act as a resonator to exert any enhancement effect on its low frequency components, thereby enabling low frequency components of the sound wave SWS radiated from the whole of the outside surface of the pipe member 102 to be also enhanced. This allows the listener to listen to any good acoustic output.

Figure 6:
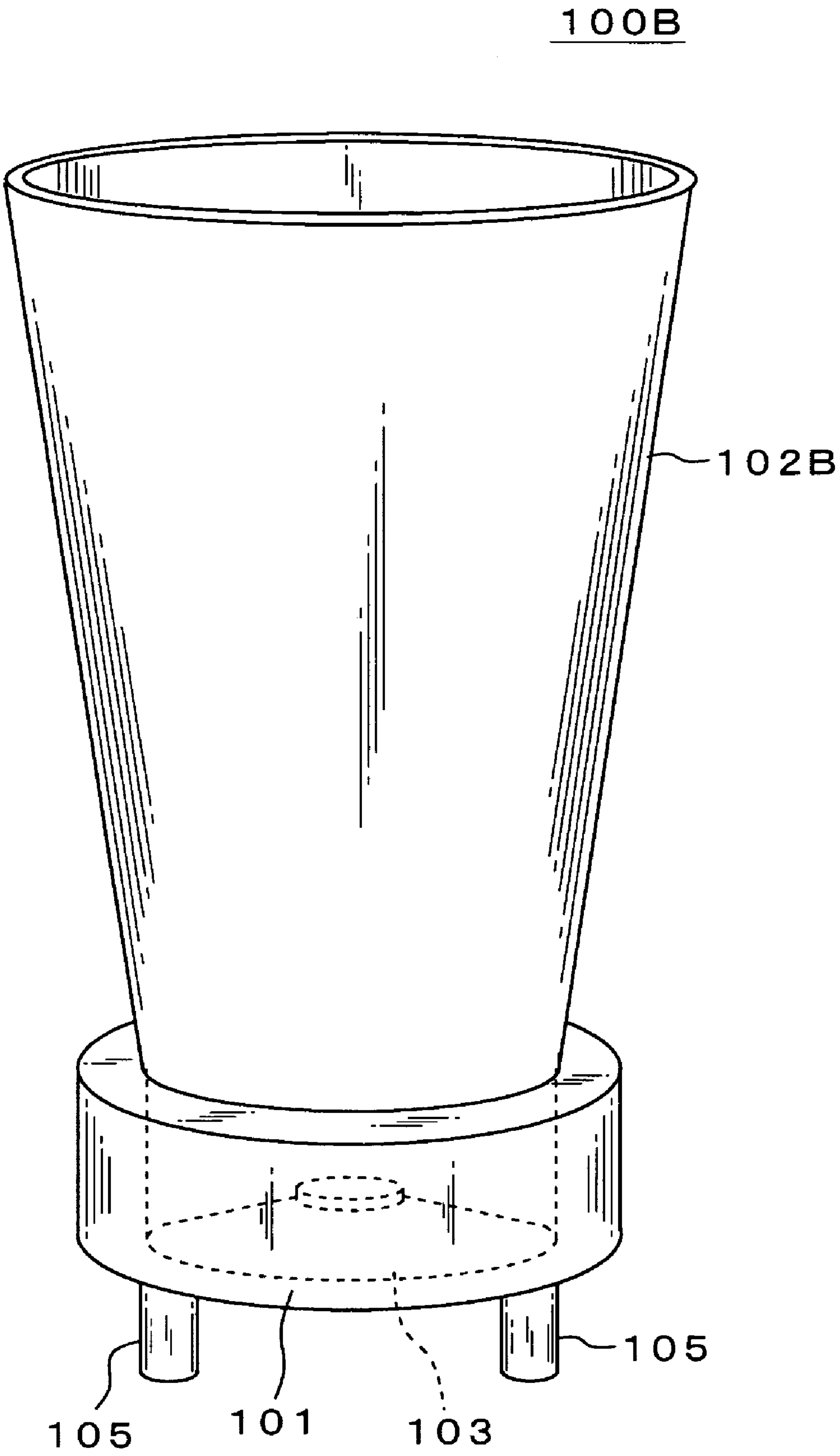
FIG. 6 is a perspective view of a speaker 100B according to another embodiment of the invention.

The following will describe a speaker 100B according to another embodiment of the invention. FIG. 6 shows a configuration of the speaker 100B according to this another embodiment of the invention. FIG. 6 shows a perspective view of the speaker 100B. In FIG. 6, like reference numbers refer to like elements of FIG. 1, a detailed explanation of which will be omitted.

The speaker 100B has a pipe member 102B in place of the pipe member 102 of the speaker 100A shown in FIG. 1. The pipe member 102B contains different diameters of its circular cross section, which are gradually made larger toward a direction where the sound wave radiated from the speaker unit 103 propagates (upwards in a case shown in FIG. 6).

Remaining parts of the speaker 100B shown in FIG. 6 are similar to those of the speaker 100A shown in FIG. 1. The speaker 100B shown in FIG. 6 operates similar to the operations of the speaker 100A shown in FIG. 1.

According to the speaker 100B, it can attain the excellent effects similar to those of the speaker 100A as well as another effect. For example, since the pipe member 102 contains different diameters of its circular cross sections, which are gradually made larger toward a direction where the sound wave radiated from the speaker unit 103 propagates, electric inductance component is increased to get a flat frequency property and a resonance dumping effect. According to the speaker 100B, an output of the pipe member from which the sound wave radiates is enlarged as compared with a pipe member having no gradually enlarged diameters of its circular cross sections, thereby enhancing the spread of acoustic image.

Although the electrodynamic actuator as the sounding body (a transducer) has been used in the speaker unit 103 in the above embodiments, this invention is not limited thereto. Another sounding body in which an actuator such as a magnetostrictive actuator or a piezoelectric actuator is used may be used.

According to the above embodiments of the invention, it is possible to spread an acoustic image to the whole of the pipe member to get the listener a global acoustic image on the speaker so that this invention is applicable to a speaker or the like that is available for the audio-visual equipment.

It should be understood by those skilled in the art that various modifications, combinations, sub-combinations and alternations may occur depending on design requirements and other factors insofar as they are within the scope of the appended claims or the equivalents thereof.

What is claimed is:

1. A speaker, comprising:

a base having a bottom surface, a circular opening, and a plurality of legs extending from the bottom surface;

a pipe member having a pipe wall and opposed open ends, the pipe wall having an inner surface and an outer surface, and one of the ends being attached to the base; and a sounding body having a front face and a main body, the sounding body being attached to any one of the opposed open ends of the pipe member on a same axis as the pipe member, the sounding body being driven by an acoustic signal supplied to the sounding body, wherein sound waves radiated from the sounding body directly pass through the inner surface of the pipe wall and vibrate the pipe wall, and wherein the sound waves corresponding to the acoustic signal radiate from the entire outer surface of the pipe wall.

2. The speaker according to claim 1, wherein the pipe member contains different diameters of circular cross section.

3. The speaker according to claim 1, wherein different diameters of the pipe member gradually increase toward a direction where the sound waves radiated from the sounding body propagate.

4. The speaker according to claim 1, wherein the pipe member has a diameter approximately equal to a diameter of the cylindrical opening of the base.

5. The speaker according to claim 1, wherein the front face of the sounding body is attached to any one of the opposed open ends of the pipe member and the main body extends into the cylindrical opening of the base.

6. The speaker according to claim 1, wherein the pipe member is formed by a light-weight and thin polycarbonate resin material.

7. A method for outputting an acoustic sound by using a sounding body, a pipe member, and a base, the sounding body having a front face and a main body, the pipe member having a pipe wall and opposed open ends, the pipe wall having an inner surface and an outer surface, and the base being attached to the pipe member and having a cylindrical opening, the method comprising the steps of:

attaching a front face of the sounding body to any one of the opposed open ends of the pipe member on a same axis as the pipe member to pass sound waves radiated from the sounding body through the inner surface of the pipe wall, the main body of the sounding body extending into the cylindrical opening of the base; and vibrating the pipe wall of the pipe member by the sound waves directly passed through the inner surface of the pipe wall to enable sound waves corresponding to an acoustic signal to radiate from the entire outer surface of the pipe wall.

8. The method according to claim 7, wherein the pipe member is formed by a light-weight and thin polycarbonate resin material.

* * * * *